(12) United States Patent
Kim (10) Patent No.: US 9,048,395 B2
(45) Date of Patent: Jun. 2, 2015

(54) LIGHT EMITTING DEVICE PACKAGE, LIGHTING MODULE AND LIGHTING SYSTEM

(75) Inventor: Sun Kyung Kim, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 453 days.

(21) Appl. No.: 12/909,098

(22) Filed: Oct. 21, 2010

(65) Prior Publication Data

US 2011/0095319 A1 Apr. 28, 2011

(30) Foreign Application Priority Data

Oct. 23, 2009 (KR) ................. 10-2009-0101227

(51) Int. Cl.
*H01L 33/52* (2010.01)
*H01L 33/50* (2010.01)
*H01L 33/56* (2010.01)

(52) U.S. Cl.
CPC ............ *H01L 33/501* (2013.01); *H01L 33/507* (2013.01); *H01L 33/56* (2013.01); *H01L 2933/0083* (2013.01); *H01L 2924/0002* (2013.01)

(58) Field of Classification Search
CPC .............. H01L 2933/0083; H01L 33/501; H01L 33/507; H01L 33/56
USPC ............................................ 257/98, E33.059
See application file for complete search history.

(56) References Cited

U.S. PATENT DOCUMENTS

| 6,963,168 | B2* | 11/2005 | Eida et al. ............... 313/506 |
| 7,084,435 | B2* | 8/2006 | Sugimoto et al. .............. 257/99 |
| 7,115,979 | B2* | 10/2006 | Park et al. ................. 257/676 |
| 7,439,552 | B2* | 10/2008 | Takigawa et al. .............. 257/98 |
| 7,652,295 | B2* | 1/2010 | Cho et al. .................. 257/79 |
| 2001/0009599 | A1* | 7/2001 | Kato et al. ................ 385/92 |
| 2005/0211991 | A1* | 9/2005 | Mori et al. ................. 257/79 |
| 2007/0012940 | A1* | 1/2007 | Suh et al. .................. 257/99 |
| 2007/0096113 | A1 | 5/2007 | Inoshita et al. ............... 257/79 |
| 2007/0176196 | A1* | 8/2007 | Kim et al. ................... 257/99 |
| 2007/0182323 | A1* | 8/2007 | Ogata et al. ................ 313/512 |
| 2007/0267637 | A1* | 11/2007 | Kim et al. ................... 257/81 |
| 2008/0006837 | A1* | 1/2008 | Park et al. ................... 257/98 |
| 2008/0087907 | A1* | 4/2008 | Park et al. ................... 257/98 |
| 2008/0173889 | A1* | 7/2008 | Shylo et al. .................. 257/98 |
| 2009/0236621 | A1 | 9/2009 | Chakraborty ................ 257/95 |

(Continued)

FOREIGN PATENT DOCUMENTS

| JP | 2003197973 A | * | 7/2003 | ............. H01L 33/00 |
| JP | 2009-146924 A | | 7/2009 | |

(Continued)

OTHER PUBLICATIONS

Korean Office Action dated Jan. 25, 2011 issued in Application No. 10-2009-0101227.

(Continued)

*Primary Examiner* — Michael Lebentritt
*Assistant Examiner* — Jordan Klein
(74) *Attorney, Agent, or Firm* — KED & Associates, LLP (57) ABSTRACT

Disclosed are a light emitting device package and a lighting system. The light emitting device package includes a semiconductor light emitting device, a first encapsulant over the semiconductor light emitting device, and a second encapsulant having a refractive index greater than a refractive index of the first encapsulant over the first encapsulant.

20 Claims, 5 Drawing Sheets

(56) References Cited

U.S. PATENT DOCUMENTS

2010/0032189 A1* 2/2010 Muto et al. .................. 174/252
2010/0133554 A1* 6/2010 Hussell ......................... 257/88
2010/0295072 A1* 11/2010 Chang et al. .................. 257/98

FOREIGN PATENT DOCUMENTS

| KR | 10-0593941 B1 | 6/2006 |
| KR | 10-2008-0030009 A | 4/2008 |
| KR | 10-0826396 B1 | 4/2008 |

OTHER PUBLICATIONS

Extended European Search Report issued in related Application No. 10188574.7 dated Feb. 28, 2014.

* cited by examiner

LIGHT EMITTING DEVICE PACKAGE, LIGHTING MODULE AND LIGHTING SYSTEM

CROSS-REFERENCE TO RELATED APPLICATION

This application claims under 35 U.S.C. §119 to Korean Patent Application No. 10-2009-0101227 filed Oct. 23, 2009, which is hereby incorporated by reference.

BACKGROUND

The embodiment relates to a light emitting device package, a lighting module and a lighting system.

A light emitting device (LED) includes a p-n junction diode having a characteristic of converting electric energy into optical energy. The p-n junction diode can be formed by combining group III elements and group V elements of the periodic table with each other. The LED can represent various colors by adjusting the compositional ratio of compound semiconductors.

When a forward voltage is applied to the LED, electrons at an n layer are combined with holes at a p layer, so that energy corresponding to an energy gap between a conduction band and a valance band may be generated. This energy is mainly emitted as heat or light, and the LED emits the energy as the light.

A nitride semiconductor represents superior thermal stability and wide band gap energy so that the nitride semiconductor has been spotlighted in the field of optical devices and high-power electronic devices. In particular, blue, green, and UV light emitting devices employing the nitride semiconductor have already been developed and extensively used.

A white light emitting device (white LED) can be realized by mixing individual R, G, B light sources with each other, or converting a phosphor through a pump beam of a UV light or a blue light. The scheme of converting the phosphor has advantages in terms of the manufacturing cost, the adjustment of a color temperature, and light emission efficiency.

Meanwhile, when the white LED is realized by utilizing the phosphor, a portion of a blue light or a UV light serving as a matrix is not absorbed into the phosphor, but extracted to the outside, and a remaining portion of the blue light or the UV light is combined with the phosphor to create a color light having a wavelength longer than that of the light of the matrix. When the extracted light and the color light are mixed with each other, white LEDs representing various color temperatures are realized according to the mixed ratios between the two lights.

However, according to the related art, when an encapsulant mixed with a phosphor is applied or a package including an encapsulant surrounding the phosphor is employed, a portion of a created light may be re-introduced into a chip due to the refractive index contrast between the encapsulant and air that is a medium observed at the final stage.

In addition, according to the related art, since a light converted by the phosphor creates a light having an omnidirectional characteristic in a spontaneous emission process, a portion of the light cannot but be re-introduced into the chip.

Therefore, according to the related art, if a light is re-introduced into the chip, light emission efficiency may be reduced due to light loss caused by the light absorption in the chip. In addition, the reliability for the chip may be degraded.

Accordingly, a package to prevent a light from being re-introduced into the chip has to be designed.

BRIEF SUMMARY

The embodiment provides a light emitting device package, a lighting module and a lighting system, capable of preventing a light, which is generated from an active layer of an LED, and a light acquired through the mixture of a phosphor and the light of the active layer from being re-introduced into a chip.

According to the embodiment, a light emitting device package includes a semiconductor light emitting device including a first conductive semiconductor layer, a second conductive semiconductor layer, and an active layer interposed between the first and second conductive semiconductor layers, a first encapsulant over the semiconductor light emitting device, and a second encapsulant having a refractive index greater than a refractive index of the first encapsulant over the first encapsulant.

According to the embodiment, a lighting system includes a substrate, and a light emitting module including a light emitting device package mounted on the substrate.

According to the embodiment, a lighting module includes a light emitting device package.

DETAILED DESCRIPTION OF THE EMBODIMENTS

Hereinafter, a light emitting device package, a lighting module and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiment

Figure 1:
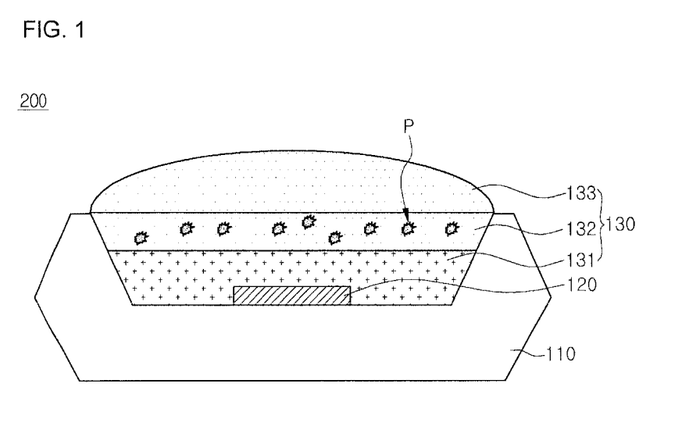
FIG. 1 is a sectional view showing a light emitting device package according to the embodiment.
Figure 2:
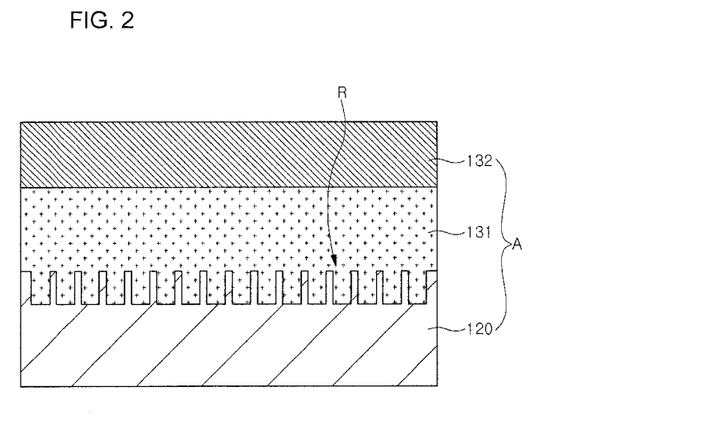
FIG. 2 is an enlarged view showing a portion of the light emitting device package according to the embodiment.

FIG. 1 is a sectional view showing a light emitting device package 200 according to the embodiment, and FIG. 2 is an enlarged view showing a portion A of the light emitting device package 200 according to the embodiment.

The light emitting device package 200 according to the embodiment includes a semiconductor light emitting device 120, a first encapsulant 131 formed over the semiconductor light emitting device 120, and a second encapsulant 132 that is formed over the first encapsulant 131 and has a refractive index greater than that of the first encapsulant 131.

In addition, the light emitting device package 200 according to the embodiment may include a package body 110 including a cavity C, the semiconductor light emitting device 120 formed in the cavity C, the first encapsulant 131 filled in a portion of the cavity C, and the second encapsulant 132 formed over the first encapsulant 131.

The light emitting device package 200 according to the embodiment may be filled with at least two types of encapsulants.

For example, the encapsulants may include the first encapsulant (E1) 131 in the contact with the semiconductor light emitting device 120 and the second encapsulant (E2) 132 spaced apart from the semiconductor light emitting device 120. In this case, the refractive index of the first encapsulant (E1) 131 is less than that of the second encapsulant (E2) 132, and a phosphor P belongs to the second encapsulant (E2) 132.

According to the embodiment, the re-introduction of a portion of a light from the phosphor P into the semiconductor light emitting device 120 can be prevented due to total reflection because the refractive index of the second encapsulant 132 is greater than that of the first encapsulant (E1) 131.

According to the embodiment, the mold shape of the second encapsulant (E2) 132 may be a dome shape, which is convex upward, instead of a flat shape. In this case, the quantity of light may be additionally increased.

According to the embodiment, a third encapsulant 133 having a dome shape may be formed over the second encapsulant 132, so that the quantity of light can be increased. In this case, the refractive index of the third encapsulant 133 may be identical to or greater than that of the second encapsulant 132.

Figure 3:
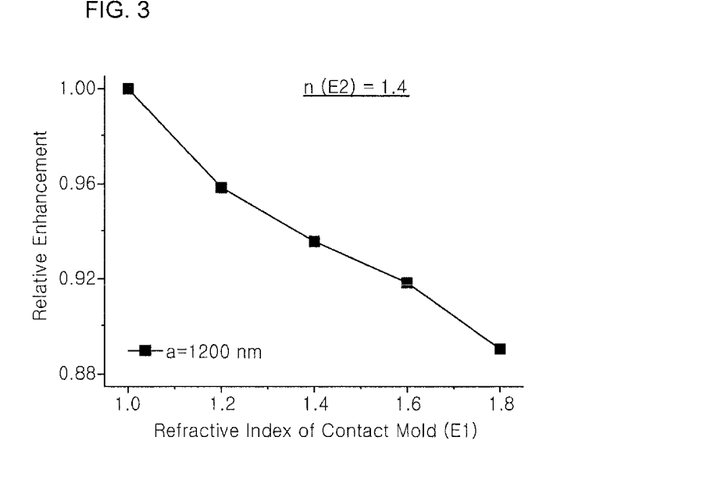
FIG. 3 is a graph showing a light extraction effect as a function of a refractive index of the light emitting device package according to the embodiment.

FIG. 3 is a graph showing a light extraction effect as a function of a refractive index of the semiconductor light emitting device 120 according to the embodiment.

For example, FIG. 3 illustrates a graph representing the light extraction effect as a function of a refractive index of the first encapsulant (E1) 131 when the refractive index of the second encapsulant (E2) 132 is 1.4, and a period a of a light extracting pattern R is about 1200 nm. In this case, the refractive index of the semiconductor light emitting device 120 may be about 2.46, but the embodiment is not limited thereto.

As shown in FIG. 3, according to the embodiment, when the light extracting pattern R, for example, a photonic crystal structure is provided at an upper portion of the semiconductor light emitting device 120, if the refractive index of the first encapsulant 131 in the contact with the semiconductor light emitting device 120 is reduced, the light extraction effect is increased. This is because the light extraction effect is determined according to the refractive index contrast of the light extracting pattern R.

For example, if the refractive index of the first encapsulant 131 is less than 1.4 that is the refractive index of the second encapsulant 132, the light extraction effect may be relatively improved.

If the refractive index of the first encapsulant 131 is reduced in a state in which the refractive index of the semiconductor light emitting device 120 is constant, the diffraction effect of the light extracting pattern R is increased. Accordingly, when the refractive index of the first encapsulant 131 is reduced, the re-introduction of a light is prevented due to the total reflection, and the light extraction efficiency can be improved.

According to the light emitting device package 200 of the embodiment, an LED chip and the package are designed in such a manner that the light generated from an active layer of the semiconductor light emitting device 120, and a light acquired from the phosphor P excited by the light of the active layer are prevented from being re-introduced into the LED chip, thereby realizing a high-efficiency white LED, and improving the reliability for the LED chip.

Hereinafter, a method of manufacturing the semiconductor light emitting device 120 will be described with reference FIGS. 4 to 7.

Figure 4:
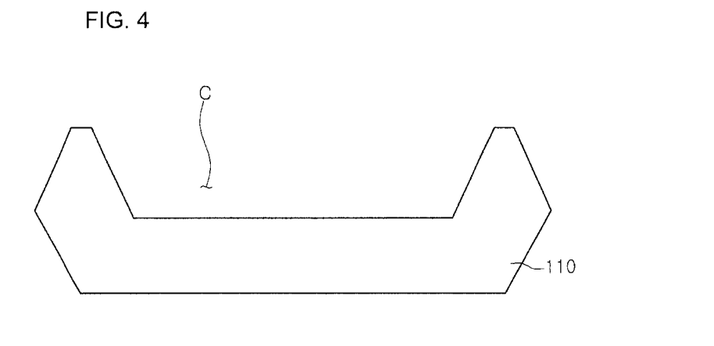
FIGS. 4 to 7 are sectional views showing the manufacturing process of the light emitting device package according to the embodiment.

As shown in FIG. 4, the package body 110 including the cavity C is formed. The package body 110 may include a silicon substrate, but the embodiment is not limited thereto. The cavity C may be formed by etching a portion of the package body 110. The cavity C may include a bottom surface and an inclined lateral surface, but the embodiment is not limited thereto.

Figure 5:
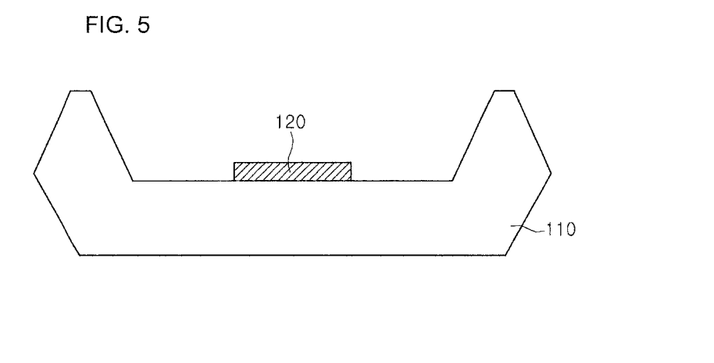

As shown in FIG. 5, the semiconductor light emitting device 120 is formed in the cavity C. For example, the semiconductor light emitting device 120 may be mounted on the bottom surface of the cavity C. In this case, the semiconductor light emitting device 120 may be a horizontal type light emitting device or a vertical type light emitting device.

According to the embodiment, the semiconductor light emitting device 120 may include a material selected from the group consisting of GaN, GaAs, GaAsP, and GaP. For example, green and blue LEDs may include GaN (InGaN), and yellow and red LEDs may include InGaAlP, or AlGaAs. Full color LEDs may be realized by changing the composition of materials. The semiconductor light emitting device 120 may include a first conductive semiconductor layer, a second conductive semiconductor layer, and an active layer between the first and second conductive semiconductor layers.

In addition, the semiconductor light emitting device 120 may include the light extracting pattern R. For example, as shown in FIG. 3, according to the embodiment, the light extracting pattern R such as the photonic crystal structure may be formed at the upper portion of the semiconductor light emitting device 120.

According to the embodiment, when holes or concavo-convex patterns formed on a surface of the semiconductor light emitting device 120 have a spatial periodicity, they are called a photonic crystal. Several parameters of the photonic crystal such as a period, an etching depth, a hole size, and a lattice arrangement are closely related to the light extraction efficiency.

According to the embodiment, the light extracting pattern R may include a multi-periodic photonic crystal structure (not shown). According to the multi-periodic photonic crystal structure, a smaller-periodic photonic crystal structure is inserted in a greater-periodic photonic crystal structure.

According to the embodiment, the multi-periodic photonic structure having various periods maintains diffraction efficiency higher than that of a photonic crystal structure having one period with respect to various angles of incidence. Accordingly, the light extraction efficiency can be improved.

Figure 6:
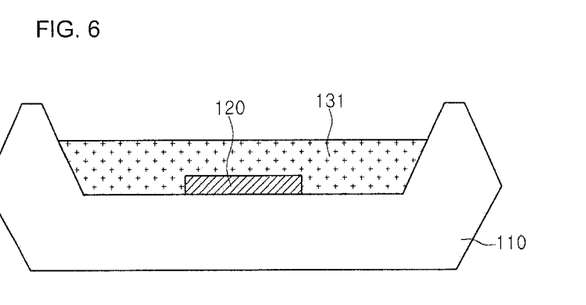

Then, as shown in FIG. 6, the first encapsulant 131 filled in a portion of the cavity C is formed. For example, the first encapsulant 131 may include silicon gel, but the embodiment is not limited thereto. According to the embodiment, the first encapsulant 131 may not include the phosphor P. Accordingly, the light generated from the semiconductor light emitting device 120 is not converted into light having a different wavelength in the first encapsulant 131, but passes through the first encapsulant 131.

In addition, according to the embodiment, the first encapsulant 131 may make contact with the semiconductor light emitting device 120.

The refractive index of the semiconductor light emitting device 120 may be greater than that of the first encapsulant 131. In this case, since the light extracting pattern R is formed at the upper portion of the semiconductor light emitting device 120, the light, which will be totally-reflected generally, is extracted to the outside of the semiconductor light emitting device 120 by the light extracting pattern R.

Figure 7:
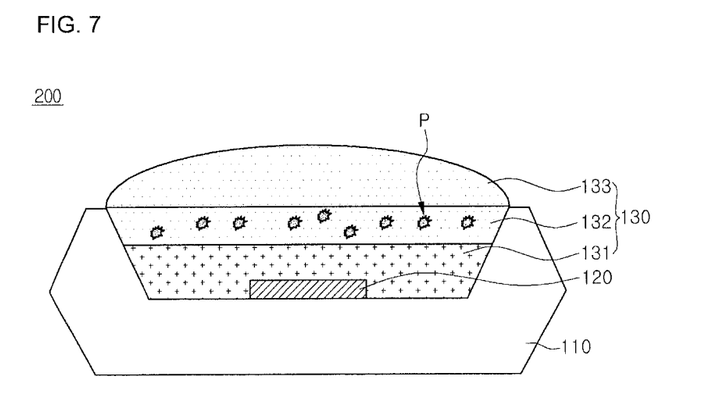

Thereafter, as shown in FIG. 7, the second encapsulant 132 is formed over the first encapsulant 131.

The second encapsulant 132 is filled in the cavity C, but the embodiment is not limited thereto.

The second encapsulant 132 may include the phosphor P. Since the light emitted by exciting the phosphor P has a wavelength longer than that of the light generated from the semiconductor light emitting device 120, the probability in which the light emitted by exciting the phosphor P is re-introduced into the semiconductor light emitting device 120 may be increased due to the light extracting pattern R. Accordingly, the phosphor P may be spaced apart from the light extracting pattern R.

According to the embodiment, in order to realize a white LED by using the phosphor P, a yellow phosphor (e.g., YAG, TAG, etc.) may be added to a blue LED, or three-color (red/green/blue) phosphors may be added to an UV LED.

For example, according to the embodiment, a yellow phosphor, such as YAG or TAG, may be added to the blue LED.

In addition, in the scheme of realizing the white LED by combining the blue LED with yellow phosphors, a white LED may be realized by adding two types (yellow+red) of phosphors or three (yellow+red+blue) phosphors to the blue LED.

According to the embodiment, the white LED may be realized by using two or three types (R, G, and B) of phosphor materials. Accordingly, a phosphor absorbs all of the UV ray emitted from the UV LED such that the light having the whole wavelength bands of a visible ray can be emitted, thereby realizing a white light. The UV LED represents light conversion efficiency superior to a YAG phosphor constituting a conventional blue LED.

According to the embodiment, the second encapsulant 132 may be spaced apart from the semiconductor light emitting device 120. In addition, the second encapsulant 132 may have a refractive index greater than that of the first encapsulant 131.

According to the embodiment, the re-introduction of a portion of the light from the phosphor P into the semiconductor light emitting device 120 is prevented due to total reflection because the refractive index of the second encapsulant 132 is greater than that of the first encapsulant 131.

According to the embodiment, the mold shape of the second encapsulant 132 may be a dome shape instead of a flat shape. In this case, the quantity of light may be additionally increased.

According to the embodiment, the third encapsulant 133 having a dome shape may be formed over the second encapsulant 132, so that the quantity of light can be increased. In this case, the refractive index of the third encapsulant 133 is identical to or greater than that of the second encapsulant 132.

According to the light emitting device package 200 and the method of manufacturing the same of the embodiment, the LED chip and the package are designed in such a manner that the light generated from the active layer of the semiconductor light emitting device 120, and the light acquired through the mixture of the phosphor P and the light of the active layer are prevented from being re-introduced into the LED chip, thereby realizing the high-efficiency white LED, and improving the reliability for the LED chip.

Figure 8:
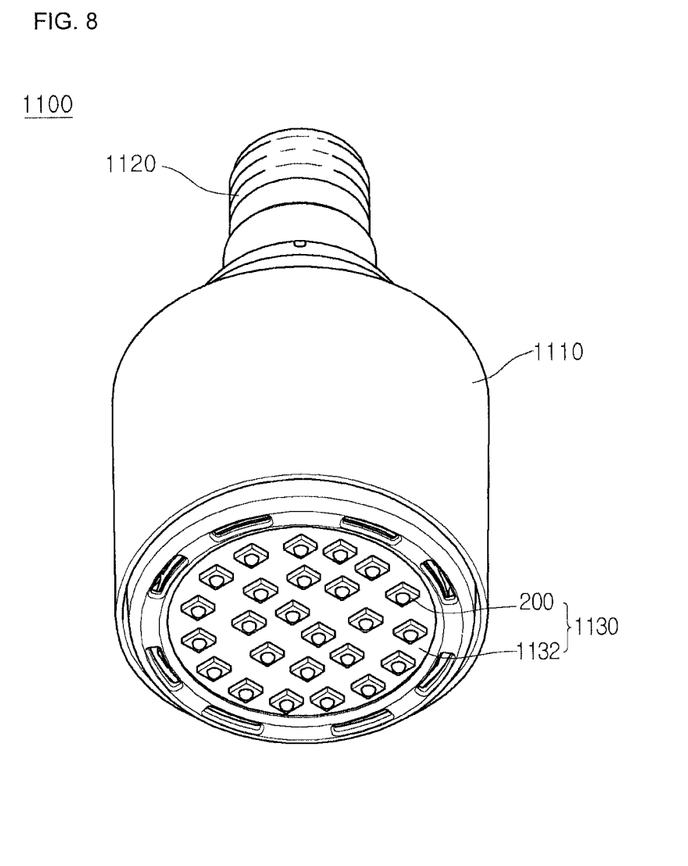
FIG. 8 is a perspective view showing a lighting unit according to the embodiment.

FIG. 8 is a perspective view showing a lighting unit 1100 according to the embodiment. The lighting unit 1100 shown in FIG. 8 is an example of a lighting system and the embodiment is not limited thereto.

Referring to FIG. 8, the lighting unit 1100 includes a case body 1110, a light emitting module 1130 installed in the case body 1110, and a connection terminal 1120 installed in the case body 1110 to receive power from an external power source.

Preferably, the case body 1110 preferably includes a material having superior heat dissipation property. For example, the case body 1110 includes a metallic material or a resin material.

The light emitting module 1130 may include a substrate 1132 and at least one light emitting device package 200 installed on the substrate 1132.

The substrate 1132 includes an insulating member printed with a circuit pattern. For example, the substrate 1132 includes a PCB (printed circuit board), an MC (metal core) PCB, an F (flexible) PCB, or a ceramic PCB.

In addition, the substrate 1132 may include a material that effectively reflects the light. The surface of the substrate 1132 can be coated with a color, such as a white color or a silver color, to effectively reflect the light.

At least one light emitting device package 200 can be installed on the substrate 1132. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1130 can be variously arranged to provide various colors and brightness. For instance, the white LED, the red LED and the green LED can be arranged to achieve the high color rendering index (CRI).

The connection terminal 1120 is electrically connected to the light emitting module 1130 to supply power to the light emitting module 1130. Referring to FIG. 8, the connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 9:
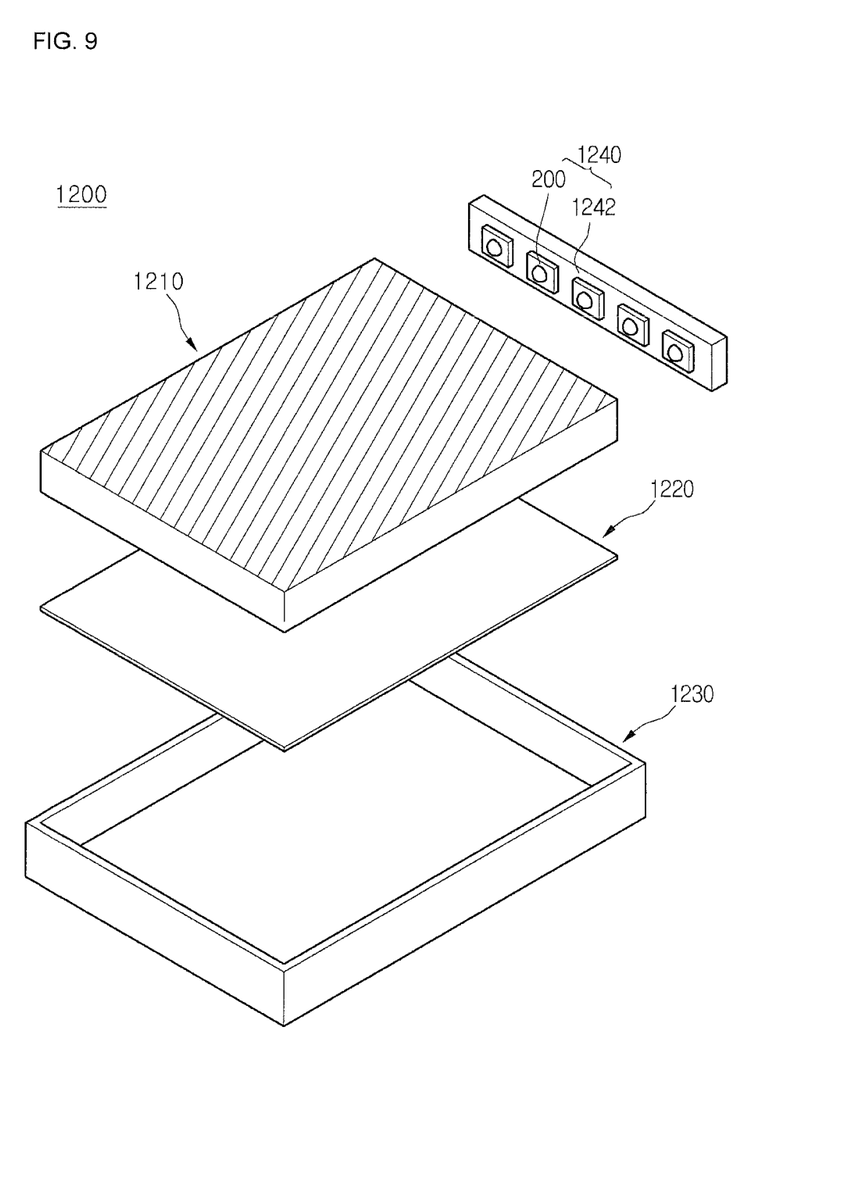
FIG. 9 is an exploded perspective view showing a backlight unit according to the embodiment.

FIG. 9 is an exploded perspective view showing a backlight unit 1200 according to the embodiment. The backlight unit 1200 shown in FIG. 9 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned under the light guide plate 1210, and a bottom cover 1230 for receiving the light guide plate 1210, light emitting module 1240, and the reflective member 1220 therein, but the embodiment is not limited thereto.

The light guide plate 1210 diffuses the light to provide a surface light. The light guide 1210 includes a transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged such that light exit surfaces of the light emitting device packages 200 are spaced apart from the light guide plate 1210 at a predetermined distance.

The reflective member 1220 is disposed under the light guide plate 1210. The reflective member 1220 reflects the light, which is traveled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using a metallic material or a resin material.

According to the light emitting device package and the lighting system of the embodiment, the LED chip and a package are designed in such a manner that the light generated from the active layer of the semiconductor light emitting device, and the light acquired through the mixture of the phosphor P and the light of the active layer are prevented from being re-introduced into the LED chip, thereby realizing the high-efficiency white LED, and improving the reliability for the LED chip.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a body having a cavity;
   a semiconductor light emitting device including a first conductive semiconductor layer, a second conductive semiconductor layer, and an active layer interposed between the first and second conductive semiconductor layers;
   a first encapsulant on the semiconductor light emitting device;
   a second encapsulant having a refractive index greater than a refractive index of the first encapsulant on the first encapsulant; and
   a third encapsulant having a refractive index greater than the refractive index of the second encapsulant and disposed on the second encapsulant,
   wherein the second encapsulant includes a phosphor,
   wherein the phosphor is spaced apart from the semiconductor light emitting device,
   wherein the first encapsulant is disposed on a first portion of the cavity and the second encapsulant is disposed on a second portion of the cavity,
   wherein the third encapsulant has a dome-shape upper portion, and
   wherein a width of a bottom surface of the third encapsulant is substantially the same as a width of an upper surface of the second encapsulant.

2. The light emitting device package of claim 1, wherein the first encapsulant contacts the semiconductor light emitting device.

3. The light emitting device package of claim 1, wherein the second encapsulant is spaced apart from the semiconductor light emitting device.

4. The light emitting device package of claim 1,
   wherein only the second encapsulant comprises a phosphor among the first encapsulant, the second encapsulant, and the third encapsulant.

5. The light emitting device package of claim 4, when a refractive index of the second encapsulant is about 1.4, and a period of the light extracting pattern R is about 1200 nm.

6. The light emitting device package of claim 1, wherein the light extracting pattern is provided at an upper portion of the semiconductor light emitting device.

7. The light emitting device package of claim 6, wherein the light extracting pattern contacts the first encapsulant, and the second encapsulant comprises a phosphor.

8. The light emitting device package of claim 6, wherein the light extracting pattern comprises a multi-periodic photonic structure.

9. The light emitting device package of claim 1, wherein the semiconductor light emitting device has a refractive index greater than the refractive index of the first encapsulant.

10. The light emitting device package of claim 1, wherein the first encapsulant includes a flat top surface, and the second encapsulant includes a flat top surface.

11. The light emitting device package of claim 10, wherein the flat top surface of the first encapsulant is parallel to the flat top surface of the second encapsulant.

12. The light emitting device package of claim 10, wherein the semiconductor light emitting device is disposed on the cavity of the body, and the flat top surface of the second encapsulant is coplanar with a top surface of the body.

13. The light emitting device package of claim 10,
    wherein the third encapsulant comprises a dome shape top surface, wherein only the second encapsulant comprises a phosphor among the first encapsulant, the second encapsulant, and the third encapsulant.

14. The light emitting device package of claim 1, wherein only the second encapsulant includes the phosphor, and the phosphor does not contact the semiconductor light emitting device.

15. The light emitting device package of claim 1, wherein the phosphor is positioned higher relative to a bottom of the cavity than the semiconductor light emitting device.

16. The light emitting device package of claim 1, wherein at least a top surface of the body is exposed from the encapsulants.

17. A light emitting device package comprising:
a body having a cavity;
a semiconductor light emitting device including a first conductive semiconductor layer, a second conductive semiconductor layer, and an active layer interposed between the first and second conductive semiconductor layers;
a first encapsulant on the semiconductor light emitting device;
a second encapsulant having a refractive index greater than a refractive index of the first encapsulant on the first encapsulant; and
a third encapsulant having a dome-shape upper portion and disposed on the second encapsulant,
wherein the first encapsulant is disposed on a first portion of the cavity and the second encapsulant is disposed on a second portion of the cavity,
wherein the semiconductor light emitting device includes a light extracting pattern and is disposed in the cavity,
wherein the third encapsulant includes a refractive index identical to or greater than that of the second encapsulant, and
wherein a width of a bottom surface of the third encapsulant is smaller than or equal to a width of an upper portion of the cavity.

18. The light emitting device package of claim 17, wherein at least a top surface of the body is exposed from the encapsulants.

19. A light emitting device package comprising:
a body having a silicon substrate or a ceramic substrate;
a semiconductor light emitting device including a first conductive semiconductor layer, a second conductive semiconductor layer, and an active layer interposed between the first and second conductive semiconductor layers;
a first encapsulant on the semiconductor light emitting device;
a second encapsulant having a refractive index greater than a refractive index of the first encapsulant on the first encapsulant; and
a third encapsulant having a refractive index greater than the refractive index of the second encapsulant and disposed on the second encapsulant,
wherein the first encapsulant is disposed on the body,
wherein the second encapsulant includes a yellow phosphor,
wherein the semiconductor light emitting device includes a light extracting structure and is disposed on the body,
wherein the yellow phosphor has a wavelength greater than that of the light generated from the semiconductor light emitting device,
wherein the third encapsulant has a dome-shape upper portion, and
wherein a bottom surface of the third encapsulant is covered by an upper surface of the second encapsulant.

20. The light emitting device package of claim 19, wherein at least a top surface of the body is exposed from the encapsulants.

* * * * *